United States Patent
Tung

[19]

[11] Patent Number: 6,071,134
[45] Date of Patent: Jun. 6, 2000

[54] CARD CONNECTOR EJECTOR MECHANISM WITH RETRACTABLE PUSH BUTTON

[75] Inventor: Shun-Chi Tung, Tu-Chen, Taiwan

[73] Assignee: Hon Hai Precision Ind. Co., Ltd., Taipei Hsien, Taiwan

[21] Appl. No.: 09/221,027

[22] Filed: Dec. 23, 1998

[30] Foreign Application Priority Data

Dec. 27, 1997 [TW] Taiwan ................................. 86221620

[51] Int. Cl.[7] .................................................. H01R 13/62
[52] U.S. Cl. ............................................................ 439/159
[58] Field of Search ...................................... 439/159, 160

[56] References Cited

U.S. PATENT DOCUMENTS

| | | | |
|---|---|---|---|
| 5,443,395 | 8/1995 | Wang ........................................ | 439/159 |
| 5,507,658 | 4/1996 | Ho ............................................ | 439/159 |
| 5,533,906 | 7/1996 | Abe ........................................... | 439/159 |
| 5,653,603 | 8/1997 | Sasao et al. ............................... | 439/159 |
| 5,713,750 | 2/1998 | Ho ............................................ | 439/159 |
| 5,730,610 | 3/1998 | Hsia et al. ................................. | 439/160 |

*Primary Examiner*—Neil Abrams
*Assistant Examiner*—Hae Moon Hyeon
*Attorney, Agent, or Firm*—Wei Te Chung

[57] ABSTRACT

A card connector for engaging an inserted IC card includes an ejector mechanism. When a card is to be ejected from the connector, an external force is exerted on a front end of a push button to activate the ejector mechanism. When the ejector mechanism is not in use, the push button can be pivoted whereby the push button is received within a space defined in a computer enclosure which houses the connector. Thus, the push button will not protrude from the computer enclosure and will not become damaged by an external force.

10 Claims, 4 Drawing Sheets

CARD CONNECTOR EJECTOR MECHANISM WITH RETRACTABLE PUSH BUTTON

BACKGROUND OF THE INVENTION

1. Field of the Invention

The present invention relates to a card connector, and particularly to an ejector mechanism for a card connector having a pivotable push button for preventing damage from occurring to the ejector mechanism by an accidental force acting on the protruding push button.

2. The Prior Art

Portable or laptop computers are provided with card connectors for receiving an IC card which expands the memory or function thereof. Each card connector is equipped with an ejector mechanism for ejecting an inserted IC card. The ejector mechanism commonly includes a push button attached to a push bar, an actuator, and an ejection plate whereby when the push button is activated by a user, the inserted card will be ejected.

Taiwan Patent Nos. 82102557, 82109139, and 83107162 and U.S. Pat. No. 5,324,204 disclose card connectors having push buttons fixedly attached to push bars and protruding from an outer surface of a computer housing when a card is inserted therein. The protruding push button may become easily damaged by an external force acting thereon which would render the entire card connector inoperable.

Taiwan Patent No. 85103753 and U.S. Pat. No. 5,443,395 disclose card connectors having push buttons which can be pivotably received within a housing of a computer when a card is inserted therein. The length of the push bar is decreased and the push button is protected from damage, however, the structure thereof is complicated which increases assembly time and manufacturing cost.

Hence, an improved card connector apparatus is requisite to eliminate the above mentioned defects of current card connectors.

SUMMARY OF THE INVENTION

Accordingly, an objective of the present invention is to provide an ejector mechanism for a card connector of a computer having a pivotably attached push button which will not be susceptible to damage by an external force.

Another objective of the present invention is to provide an ejector mechanism for a card connector which comprises a limited number of elements of simple structure which are easily assembled.

To fulfill the above mentioned objectives, according to one embodiment of the present invention, a card connector for engaging an inserted IC card includes an insulative housing having a pair guiding arms extending therefrom, and an ejector mechanism comprising an ejection plate, an actuator, a cover, a push rod having an elongate main body engaged with the actuator one end and forming a push head at another end thereof, a pair of passages formed on one of the guiding rails for extension of the push rod therethrough, a push button, and a pin. The push head comprises a connecting portion extending from the main body, a supporting wall extending from the connecting portion, a push socket perpendicularly extending from the supporting wall, a groove defined along a length of the push socket, and a stop wall upwardly extending from one end of the push socket proximate the connecting portion. A cavity is defined in the push button for receiving the push socket therein during operation of the ejector mechanism. The push button has a hole vertically defined through a rear portion thereof for receiving the pin therein whereby the pin extends through the groove of the push head.

When a card is to be ejected from the connector, an external force is exerted on a front end of the push button to activate the ejector mechanism. When the ejector mechanism is not in use, the push button can be pivoted whereby the push button is received within a space defined in a computer enclosure which houses the connector. Thus, the push button will not protrude from the computer enclosure and will not become damaged by an external force.

These and additional objectives, features, and advantages of the present invention will become apparent after reading the following detailed description of the preferred embodiment of the invention taken in conjunction with the appended drawing figures.

DETAILED DESCRIPTION OF THE PREFERRED EMBODIMENT

Reference will now be made in detail to the preferred embodiment of the present invention.

Figure 1:
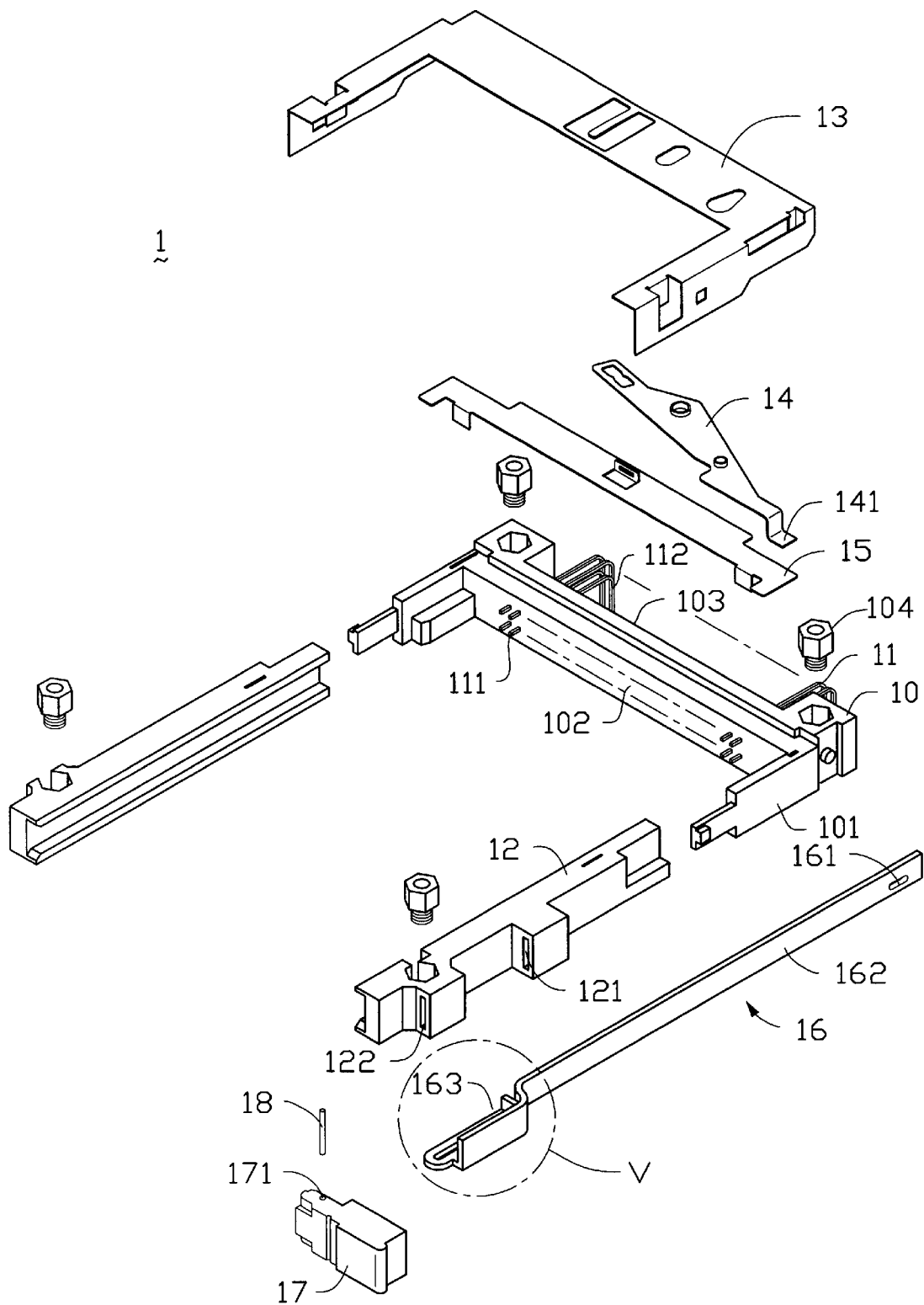
FIG. 1 is an exploded view of a card connector in accordance with a preferred embodiment of the present invention.

Referring to FIG. 1, a card connector 1 in accordance with the present invention includes a generally U-shaped insulated housing 10 having a mating face 102 and a connecting face 103, and an ejector mechanism (not labeled). The housing 10 interferentially receives a number of terminals 11 therethrough whereby contact portions 111 thereof project beyond the mating face 102 for engagement with an electrical card (not shown) and tail portions 112 thereof are soldered to a printed circuit board (not shown). A pair of mounting arms 101 extend from opposite lateral ends of the housing 10 each fittingly engaging with a guiding rail 12 which guides an electrical card toward the terminals 11 of the housing 10. Four screws 104 are used to connect the card connector 1 to a stacked connector (not shown) or a PCB.

The ejector mechanism includes an ejection plate 15, an actuator 14 forming a tongue 141 at an end thereof, a cover 13, a push rod 16 having an elongate main body 162 defining a slot 161 in one end and forming a push head 163 at another end thereof, a pair of passages 121, 122 formed on one of the guiding rails 12, a push button 17, and a pin 18. The push head 163 comprises a connecting portion 1631 extending from the main body 162, a supporting wall 1632 extending from the connecting portion 1631, a push socket 1633 perpendicularly extending from the supporting wall 1632, a groove 1634 defined along a length of the push socket 1633, and a stop wall 1635 upwardly extending from one end of the push socket 1633 proximate the connecting portion 1631. The push button 17 has a hole 171 vertically defined through a rear portion thereof for receiving the pin 18 therein. A cavity (not shown) is defined in the rear portion of the push button 17 for receiving the push socket 1633 therein during operation of the ejector mechanism.

To assemble the card connector 1, the ejection plate 15, actuator 14, and cover 13 are mounted onto the housing 10.

Figure 2:
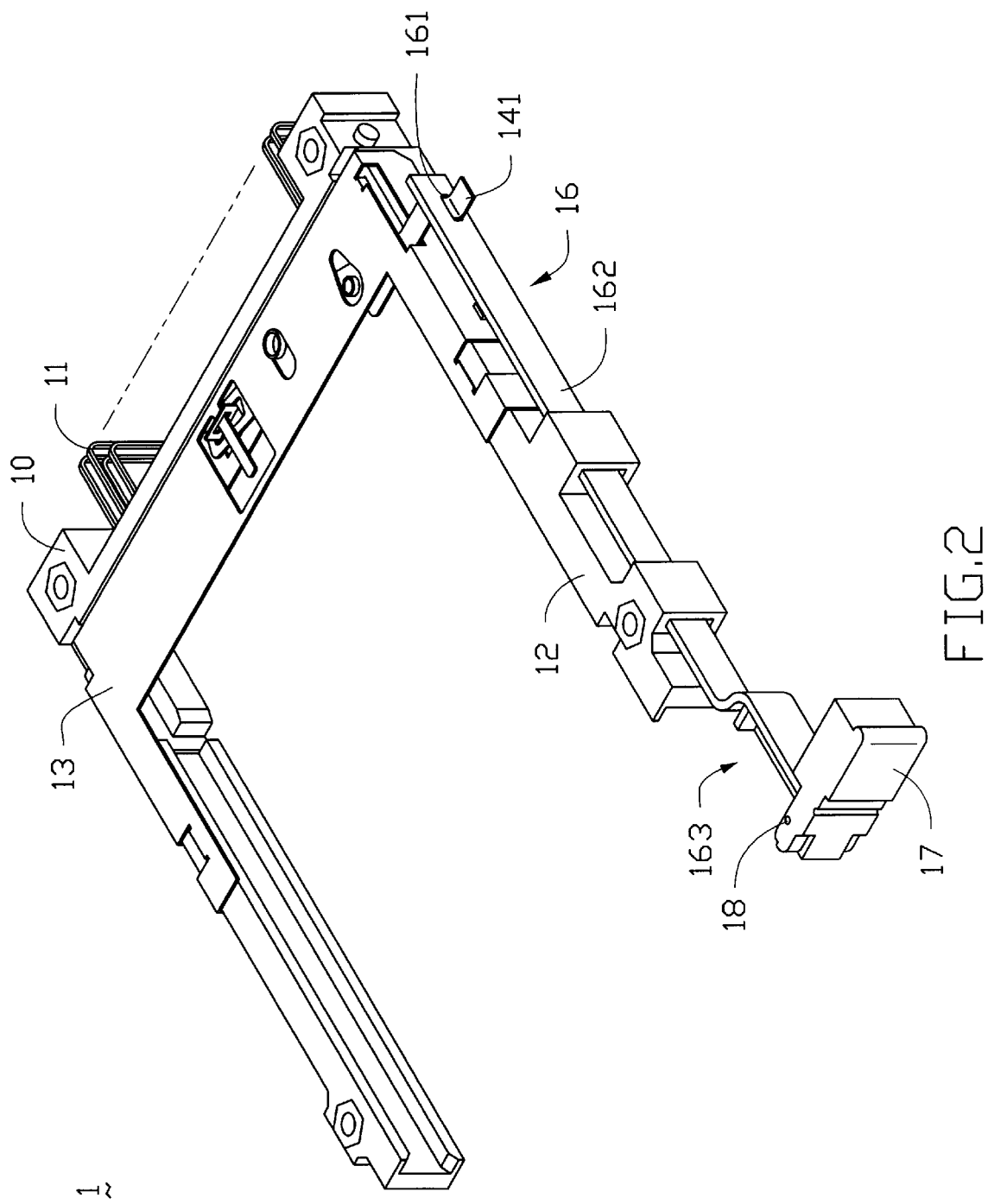
FIG. 2 is an assembled view of FIG. 1.

The push rod 16 is inserted through the passages 121, 122 and the tongue 141 of the actuator 14 is received in the slot 161 of the push rod 16. The push button 17 is brought to receive the push socket 1633 in the cavity thereof. The pin 18 is then inserted through the hole 171 of the push button 17 whereby the pin 18 extends through the groove 1634 of the push head 163. Thus, the card connector is fully assembled as seen in FIG. 2.

Figure 3:
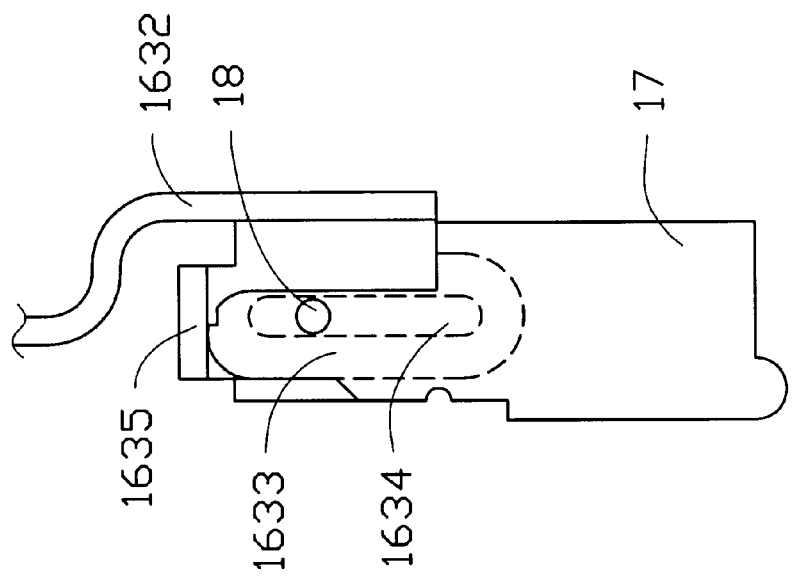
FIG. 3 is a schematic view of a push button in accordance with the present invention in an activated position.
Figure 5:
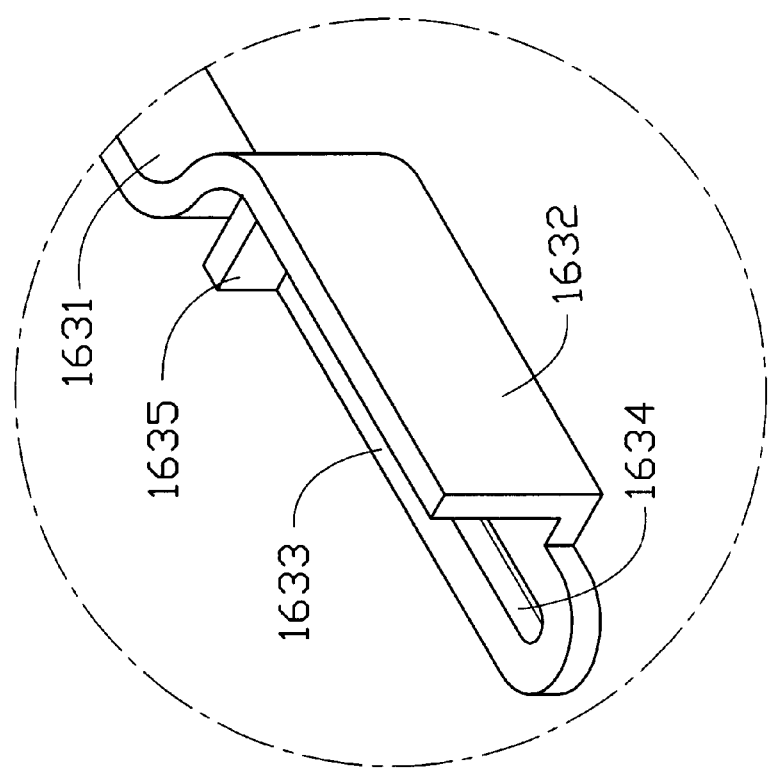
FIG. 5 is an enlarge view of a circle V in FIG. 1.

Referring to FIGS. 3 and 5, when a card is to be ejected from the connector 1, an external force is exerted on a front end of the push button 17. The provision of the pin 18 and the groove 1634 allows the push socket 1633 to be fully received in the cavity of the push button 17 until a rear end of the push button 17 abuts against the stop wall 1635 of the push head 163. When an external force is further exerted on the front end of the push button 17, the ejector mechanism will be activated to eject an inserted card. Since the operation of the ejector mechanism is well known by those skilled in the art, a detailed description thereof is omitted herein.

Figure 4:
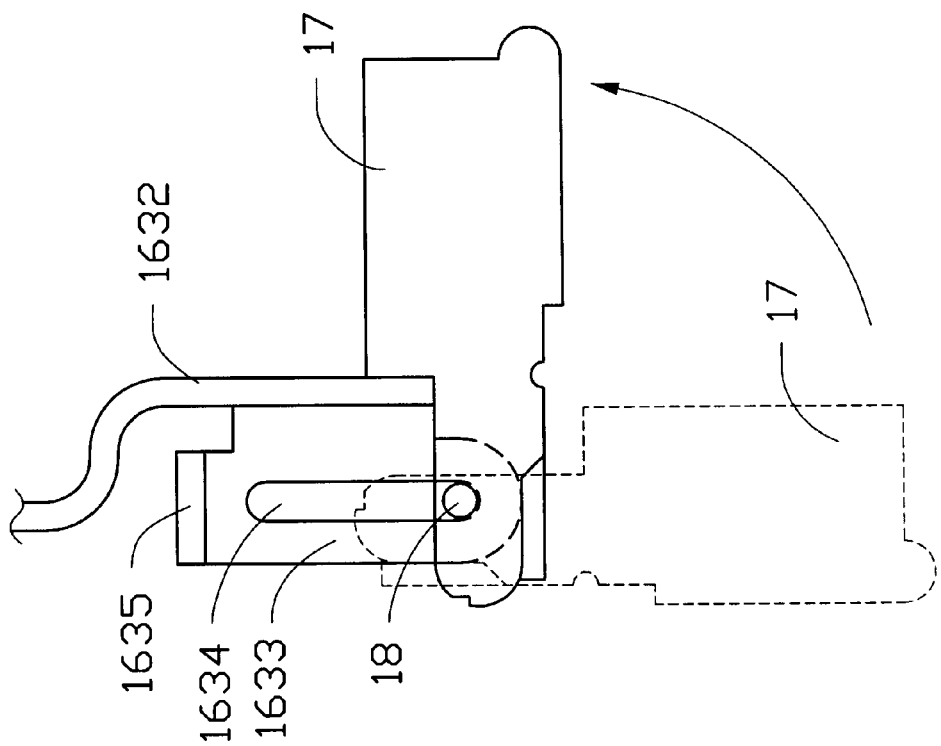
FIG. 4 is a schematic view of the push button in both a protruding position and a pivoted position.

Referring to FIG. 4, when the ejector mechanism is not in use, the push button 17 protrudes from a computer enclosure (not shown) which houses the connector 1. The provision of the pin 18 and the groove 1634 of the push head 163 allow the push button 17 to be pivoted whereby the push button 17 is received within a space defined in the computer enclosure. Thus, the push button 17 will not protrude from the computer enclosure and will not become damaged by an external force.

Understandably, a retraction spring may be linked between the push button and the push head so that the push button is always in either a folded manner as shown in FIG. 4 or a fully embedded manner as shown in FIG. 3. Additionally, because the push button will not activate the push rod until the rear end thereof abuts against the stop wall of the push head and a portion of the push button may somewhat confront the supporting wall, it assures the push button may not intend to easily incorrectly pivot during ejection but move in the correct lengthwise direction.

While the present invention has been described with reference to a specific embodiment, the description is illustrative of the invention and is not to be construed as limiting the invention. Various modifications to the present invention can be made to the preferred embodiment by those skilled in the art without departing from the true spirit and cope of the invention as defined by the appended claims.

I claim:

1. A card connector for engaging an inserted IC card, comprising:

an insulative housing having guiding rails attached thereto for guiding an inserted card therein;

a plurality of conductive terminals interferentially received in the housing; and an ejector mechanism including at least an ejection plate, an actuator, a push rod having an elongate main body engaging with the actuator at one end and forming a push head at another end thereof, and a push button pivotably engaged with the push head for receiving an external force to activate the ejector mechanism and eject an inserted card;

whereby when the ejector mechanism is not in use, the push button can be pivotably received within a space defined in a computer enclosure which houses the connector so that the push button will not protrude from the computer enclosure and the ejector mechanism will not become damaged by an external force, wherein the push head further comprises a connecting portion extending from the main body of the push rod, a supporting wall extending from the connecting portion, a push socket perpendicularly extending from the supporting wall, a groove defined along a length of the push socket, and a stop wall upwardly extending from one end of the push socket proximate the connecting portion.

2. The connector as described in claim 1, wherein the push button defines a cavity for receiving the push socket of the push head during operation of the ejector mechanism.

3. The connector as described in claim 2, wherein the push button has a hole vertically defined through a rear portion thereof for receiving a pin therein, the pin extending through the groove of the push socket which allows the push socket to be fully received in the cavity of the push button until a rear end of the push button abuts against the stop wall of the push head.

4. The connector as described in claim 1, wherein at least a passage is formed on one of the guiding rails.

5. The connector as described in claim 4, wherein the push rod extends through the passages.

6. The connector as described in claim 1 further including a cover mounted to the housing on top of the actuator, ejection plate, and housing.

7. An ejector mechanism including at least an ejection plate, an actuator, a push rod having an elongate main body engaging with the actuator at one end and forming a push head at another end thereof, and a push button pivotably engaged with the push head for receiving an external force to activate the ejector mechanism and eject an inserted card;

whereby when the ejector mechanism is not in use, the push button can be pivotably received within a space defined in a computer enclosure which houses the connector so that the push button will not protrude from the computer enclosure and the ejector mechanism will not become damaged by an external force, wherein the push head further comprises a connecting portion extending from the main body of the push rod, a supporting wall extending from the connecting portion, a push socket perpendicularly extending from the supporting wall, a groove defined along a length of the push socket, and a stop wall upwardly extending from one end of the push socket proximate the connecting portion.

8. The connector as described in claim 7, wherein the push button defines a cavity for receiving the push socket of the push head during operation of the ejector mechanism.

9. The connector as described in claim 8, wherein the push button has a hole vertically defined through a rear portion thereof for receiving a pin therein, the pin extending through the groove of the push socket which allows the push socket to be fully received in the cavity of the push button until a rear end of the push button abuts against the stop wall of the push head.

10. The connector as described in claim 7, wherein at least a passage is formed on one of the guiding rails.

* * * * *